United States Patent
Teng et al.

(10) Patent No.: US 6,465,369 B1
(45) Date of Patent: Oct. 15, 2002

(54) METHOD FOR STABILIZING SEMICONDUCTOR DEGAS TEMPERATURE

(75) Inventors: Tun-ho Teng, Tao Yuan (TW); Ta-te Chen, Taipei (TW); Chih-hung Shu, Hsinchu (TW); Chan-bin Ho, Taipei (TW)

(73) Assignee: Mosel Vitelic Inc. (TW)

( * ) Notice: Subject to any disclaimer, the term of this patent is extended or adjusted under 35 U.S.C. 154(b) by 0 days.

(21) Appl. No.: 09/488,847

(22) Filed: Jan. 21, 2000

(30) Foreign Application Priority Data

Oct. 6, 1999 (TW) .................................. 88117348 A

(51) Int. Cl.[7] .............................................. H01L 21/31
(52) U.S. Cl. ........................ 438/781; 438/660; 118/724
(58) Field of Search ............................... 438/781, 660, 438/778, 780; 118/725, 724

(56) References Cited

U.S. PATENT DOCUMENTS

| | | | | |
|---|---|---|---|---|
| 5,002,010 A | * | 3/1991 | Weinburg | 118/719 |
| 5,106,787 A | * | 4/1992 | Yen | 438/800 |
| 5,259,881 A | * | 11/1993 | Edwards et al. | 118/719 |
| 5,982,986 A | * | 11/1999 | Davenport | 392/418 |
| 6,182,376 B1 | * | 2/2001 | Shin et al. | 34/418 |
| 6,291,252 B1 | * | 9/2001 | Yu et al. | 438/5 |
| 6,375,743 B2 | * | 4/2002 | Sundarrajan et al. | 118/697 |

* cited by examiner

*Primary Examiner*—Carl Whitehead, Jr.
*Assistant Examiner*—Jeff Vockrodt

(57) ABSTRACT

A method for stabilizing a degas temperature of wafers in a degas chamber comprises (a) setting an electrical heater at an initial output power, (b) heating each wafer for a first period of time to keep the temperature of the wafer at a predetermined range by setting the electrical heater at a first output power equal to or higher than the initial output power, (c) heating the wafer for a second period of time to increase the temperature of the wafer to a predetermined value by raising the output power of the electrical heater to a second output power; and (d) heating the wafer for a third period of time by reducing the output power of the electrical heater to a third output power. The method lessens the "first wafer effect" and the "temperature-accumulated effect". Therefore, the temperature of the wafers can be well controlled before a subsequent sputtering process.

8 Claims, 2 Drawing Sheets

METHOD FOR STABILIZING SEMICONDUCTOR DEGAS TEMPERATURE

BACKGROUND OF THE INVENTION

A. Field of the Invention

The invention relates to a method for stabilizing semiconductor degas temperature. In particular, the invention relates to a method for stabilizing the wafer temperature inside the degas chamber of semiconductor manufacturing equipment.

B. Description of the Prior Art

Physical vapor deposition(PVD) technology is generally applied to the process of metal sputtering deposition in manufacturing semiconductors. If the wafer temperature is precisely controlled in sputtering equipment, the wafer can be deposited with a film of desired composition and crystalline structure. Referring to FIG. 1, sputtering equipment comprises a set of robots 10 for transferring wafers, one buffer chamber 20, two cassette loading chambers 30, two degas chambers 40 and four sputtering chambers 50. A wafer is transferred through buffer chamber 20 and placed into a degas chamber 40 by using a robot 10. The wafer is oriented and degassed in the degas chamber 40. Then, the wafer is transferred to a sputtering chamber 50 for sputtering by using a robot 10.

After the degassing process of a first wafer of a batch of unprocessed wafers is finished, a second wafer is degassed and the other wafers are also degassed subsequently until the whole batch of wafers are degassed. The initial temperature of a wafer is defined as the wafer temperature at which the pedestal starts to heat the wafer when the wafer is transferred into the degas chamber. In conventional degassing methods, the initial temperature of the first wafer after being transferred into the degas chamber is low since the degas chamber has been idled for a period of time. Since the temperature of the degas chamber 40 is controlled in accordance with an open-loop controlling method, the low initial temperature makes it difficult to raise the temperature of the first wafer after degassing to a setting value. This phenomenon is known as "first wafer effect".

Besides, in conventional degassing methods, the temperature of the degas chamber increases after the degassing process of the first wafer. This causes the initial temperature of the second wafer to become much higher than that of the first wafer. Moreover, the temperature after the degassing process of the second wafer is higher than that of the first wafer. Similarly, the initial temperature of the third wafer is higher than that of the second wafer and the temperature after the degassing process of the third wafer is higher than that of the second wafer. After the degassing process of the whole batch of wafers, the temperature of the last wafer will be much higher than that of the first and second wafers. Such a continuous degassing process causes a so-called "temperature accumulated effect" in which the initial temperature, the final temperature and the highest temperature of the wafers increase wafer by wafer.

Thus, the temperature of the whole batch of wafers deviates from the setting value after degassing. This temperature error will affect the grain size, the lattice structure and the roughness of films when the wafers are sputtered in the sputtering chamber and have a certain effect on the wafer structure e.g., the wafer profile which is defined in the precedent process.

FIG. 2 shows the output power curve of an electrical heater according to a conventional degassing method. The X-axis and Y-axis of the diagram represent time and the ratio(%) of the output power to the saturated output power of the electrical heater, respectively. Hereinafter, the ratio is represented as power rate. The method comprises two steps to heat wafers. Before $t_0$, the degas chamber is in an idle status and this status is called an idle baking step. The power rate of the electrical heater in the idle baking step is set as 7%. During time period $t_0 \sim t_1$, a first degassing step is performed. The time period of the first degassing step is set at 30 seconds and the power rate of the electrical heater is set at 30%. During time period $t_1 \sim t_2$, a second degassing step is performed. The time period of the second degassing step is set at 40 seconds and the power rate of the electrical heater is set at 60%. The temperature of the wafer is defined as $T_{ab}$, where "a" represents the order of the wafer being transferred into the degas chamber, "b" represents the timing of baking, "b=0" represents the timing at the end of the idle baking step, and "b□0" represents the timing at the end of the first degassing step or the second degassing step. The desired temperature of wafer is set at "T". Since the degas chamber has been idled for a period of time before the first wafer is transferred into the degas chamber, the temperature $T_{11}$ after the first degassing step is low. Although the power rate of the electrical heater is raised from 30% to 60%, the temperature $T_{12}$ after degassing still can not reach T. When the second wafer is transferred into the degas chamber 40, the degas chamber door 60 is open. Thus, the degas chamber temperature as well as the initial wafer temperature of the second wafer, is slightly lower than $T_{12}$ but higher than $T_{10}$. Therefore, the temperature $T_{22}$ after degassing is higher than $T_{12}$ and is close to T. Similarly, $T_{30}$ is higher than $T_{20}$, and $T_{32}$ is higher than $T_{22}$. Since the temperature is controlled in accordance with an open-loop method, a great temperature difference between the temperature of the last wafer and $T_{12}$, $T_{22}$ is caused, and there will be a substantial error between the temperature after degassing of each wafer and the setting value.

SUMMARY OF THE INVENTION

An object of the present invention is to provide a method for solving the problems mentioned above. In accordance with the present invention, the method comprises the following steps:

idle baking step: raising the power rate of the electrical heater to 7%~9%, preferably 9%.

first degassing step: setting the power rate of the electrical heater to 9%~15%, preferably 9% and prolonging the heating time $t_0 \sim t_1$ maintain the temperature of the wafer after the first wafer at a certain range.

second degassing step (major ramp up step): raising the power rate of the electrical heater to 60%~80%, preferably 70% and heating the wafer to the setting value T.

third degassing step (stabilizing temperature control step): reducing the power rate of the electrical heater to 5%~15%, in order to avoid overshoot in temperature control and to stabilize temperature control.

By means of the method of the present invention, the first wafer effect and the temperature accumulated effect of the wafers after the first wafer can be reduced.

BRIEF DESCRIPTION OF THE DRAWINGS

The objects and other advantages of the present invention are best understood with reference to the preferred embodiment when read in conjunction with the following drawings, wherein.

DETAILED DESCRIPTION OF THE PREFERRED EMBODIMENTS

The method for stabilizing semiconductor degas temperature according to the present invention is now described in detail.

Figure 1:
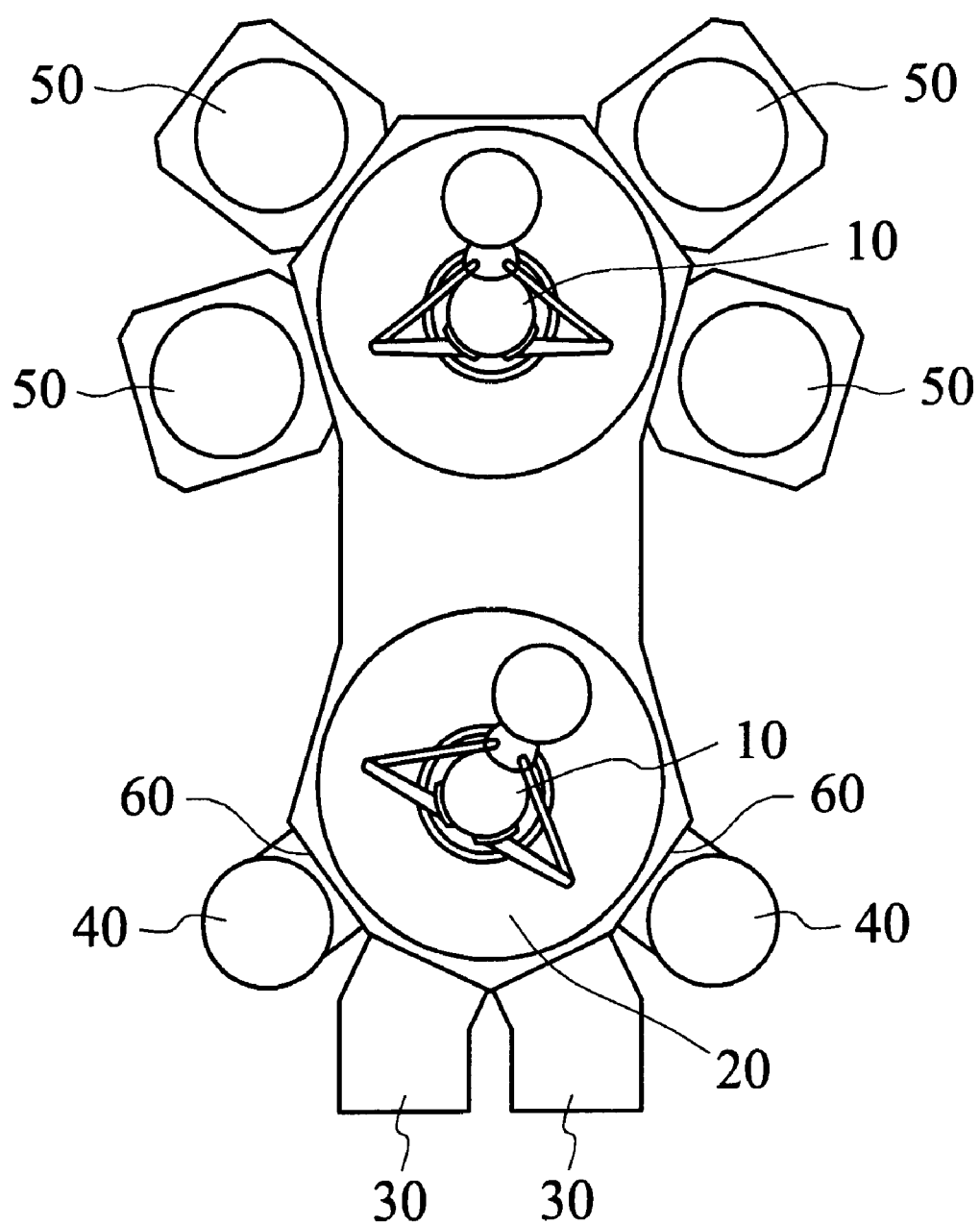
FIG. 1 shows the structure of sputtering equipment.
Figure 2:
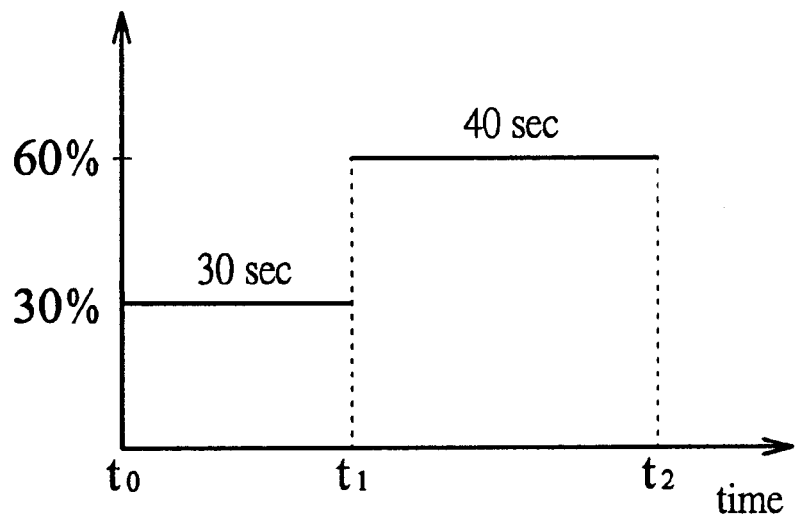
FIG. 2 shows the output power curve of an electrical heater according to the conventional degassing method.
Figure 3:
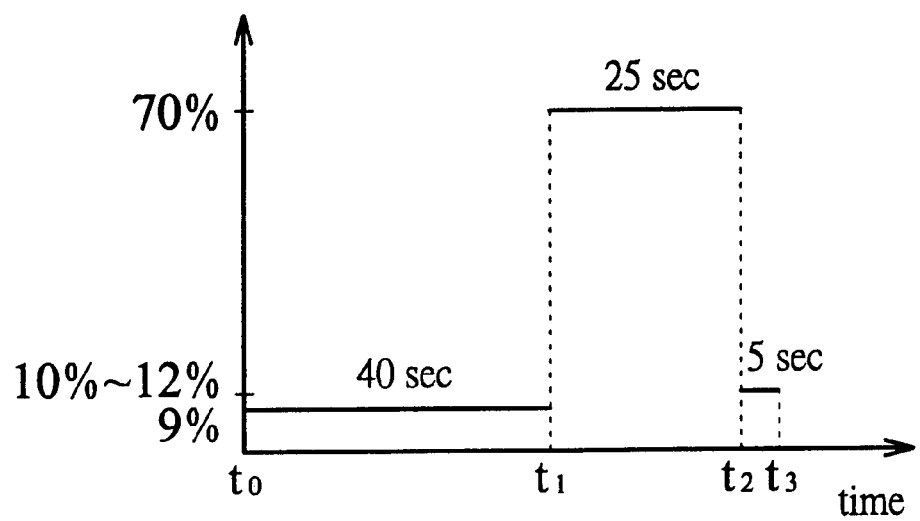
FIG. 3 shows the output power curve of an electrical heater according to the degassing method of the present invention.

The preferred embodiment of the present invention is shown in FIG. 3.

Referring to FIG. 3, the method for changing the power rate of an electrical heater and improving the temperature control program of the electrical heater includes the following steps : an idle baking step in which the power rate of the electrical heater is set at 7%~9%, preferably 9%; a first degassing step in which the power rate of the electrical heater is set at 9%~15%, preferably 9%, and the heating time is set at not less than 40 seconds, preferably 40 seconds; a second degassing step in which the power rate of the electrical heater is set at 60%~80%, preferably 70%, and the heating time is set at 25 seconds; a third degassing step in which the power rate of the electrical heater is set at 5%~15%, and the heating time is set at 5 seconds.

After the first wafer is transferred into the degas chamber, the initial temperature of the wafer can reach a stable value by reducing the power rate of the electrical heater in the idle baking step and prolonging the heating time of the first degassing step. Therefore, the wafer temperature after the first degassing step can be more stable than in the conventional method. Then, the wafer is heated in the second degassing step and its temperature is raised rapidly to a predetermined value. Finally, the wafer temperature is lowered by reducing the power rate of the electrical heater in the third degassing step to converge the wafer temperature to the setting value more closely. In this manner, the over-high temperature of the degas chamber that is previously caused by the continuous heating in the second degassing step can be avoided and the temperature control of the degassing process can be more stable. Meanwhile, the wafer temperature can be closer to the setting value than the wafer temperature obtained in the conventional method, and thereby the first wafer effect can be reduced. Moreover, by setting the electrical heater at a low power rate and extending the processing time in the first degassing step, the temperature of the subsequent wafers being transferred into the degas chamber after the first wafer can be controlled at a certain range. Then, the subsequent wafers are heated in the second and third degassing steps so that their temperatures after degassing are closer to the setting value and the temperature differences between the wafers are reduced. Thus, the temperature accumulated effect can be avoided. The temperature comparison of each wafer after degassing between the embodiment of the invention and the conventional method is shown in Table 1. As can be seen from Table 1, the wafer temperature of the conventional method does not converge to the setting value (about 213° C.) until the sixth wafer while the temperature of the second wafer of the inventive preferred embodiment already converges to the setting value. Also, the temperature difference between each of the wafers after the first wafer in the present invention is reduced; that is, the temperature accumulated effect is obviously suppressed. Further, the temperature of the first wafer reaches the setting value more closely than the conventional method; that is, the first wafer effect is clearly suppressed.

TABLE 1

| Conventional method | | Present invention | |
| --- | --- | --- | --- |
| wafer | temperature after degassing | wafer | temperature after degassing |
| 01 | 170° C. | 01 | 196° C. |
| 02 | 181° C. | 02 | 212° C. |
| 03 | 187° C. | 03 | 213° C. |
| 04 | 190° C. | 04 | 209° C. |
| 05 | 194° C. | 05 | 215° C. |
| 06 | 209° C. | 06 | 214° C. |
| 07 | 210° C. | | |
| 08 | 213° C. | | |

While the present invention has been described with reference to the specific embodiment, the description is only illustrative and is not to be construed as limiting the invention. Various modifications and applications can be made without departing from the true spirit and scope of the invention as defined by the appended claims. For example, although the present invention is employed in sputtering equipment, in a broad sense, it can also be applied to the general semiconductor manufacturing equipment which requires wafer degassing.

What is claimed is:

1. A method for stabilizing a degas temperature of wafers in a degas chamber of semiconductor manufacturing equipment, said method comprising:

an idle baking step for setting an electrical heater at an initial output power, wherein the electrical heater is connected with said degas chamber;

a first degassing step for heating each wafer for a first period of time to keep the temperature of said each wafer at a predetermined range by setting said electrical heater at a first output power, wherein the first out power is equal to or higher than said initial output power;

a second degassing step for heating said each wafer for a second period of time to increase the temperature of said each wafer to a predetermined value by raising the output power of said electrical heater to a second output power; and a third degassing step for heating said each wafer for a third period of time by reducing the output power of said electrical heater to a third output power.

2. The method of claim 1, wherein said initial output power of said electrical heater in said idle baking step is from about 7% to about 9% of a saturated output power of said electrical heater.

3. The method of claim 1, wherein said first output power of said electrical heater in said first degassing step is from about 9% to about 15% of the saturated output power of said electrical heater.

4. The method of claim 1, wherein said first period of time is not less than 40 seconds.

5. The method of claim 1, wherein said second output power of said electrical heater in said second degassing step is from about 60% to about 80% of the saturated output power of said electrical heater.

6. The method of claim 1, wherein said third output power of said electrical heater in said third degassing step is from about 5% to about 15% of the saturated output power of said electrical heater.

7. The method of claim 3, wherein said second output power of said electrical heater in said second degassing step is from about 60% to about 80% of the saturated output power of said electrical heater.

8. The method of claim 5, wherein said third output power of said electrical heater in said third degassing step is from about 5% to about 15% of the saturated output power of said electrical heater.

* * * * *